US006593064B1

(12) United States Patent
Gelbart

(10) Patent No.: US 6,593,064 B1
(45) Date of Patent: Jul. 15, 2003

(54) HIGH RESOLUTION OPTICAL STEPPER

(75) Inventor: Daniel Gelbart, Burnaby (CA)

(73) Assignee: Creo Inc., Burbaby (CA)

( * ) Notice: Subject to any disclaimer, the term of this patent is extended or adjusted under 35 U.S.C. 154(b) by 33 days.

(21) Appl. No.: 09/689,883

(22) Filed: Oct. 13, 2000

Related U.S. Application Data

(62) Division of application No. 09/110,378, filed on Jun. 19, 1998, now abandoned.

(51) Int. Cl.[7] .......................... G03B 27/52; G03C 5/00; G03F 7/00
(52) U.S. Cl. ...................... 430/311; 430/296; 430/312; 430/394; 430/396
(58) Field of Search ................................ 430/311, 312, 430/394, 396; 250/492.2, 492.22

(56) References Cited

U.S. PATENT DOCUMENTS

| | | | | |
|---|---|---|---|---|
| 3,630,732 A | * | 12/1971 | Delzenne et al. ............ 430/326 |
| 4,066,458 A | * | 1/1978 | Stuckert ...................... 430/394 |
| 4,619,894 A | | 10/1986 | Bozler et al. ................ 430/942 |
| 4,796,038 A | | 1/1989 | Allen et al. ...................... 354/4 |
| 5,001,038 A | | 3/1991 | Dorinski et al. ............ 430/311 |
| 5,100,508 A | * | 3/1992 | Yoshida et al. .............. 430/312 |
| 5,132,723 A | | 7/1992 | Gelbart ......................... 355/40 |
| 5,182,188 A | | 1/1993 | Cole, Jr. et al. ............ 430/323 |
| 5,266,445 A | * | 11/1993 | Seligson ...................... 430/311 |
| 5,298,761 A | | 3/1994 | Aoki et al. .................. 250/548 |
| 5,328,811 A | | 7/1994 | Brestel ........................ 430/325 |
| 5,461,455 A | | 10/1995 | Coteus et al. .................. 355/43 |
| 5,512,418 A | | 4/1996 | Ma .......................... 430/271.1 |
| 5,521,748 A | * | 5/1996 | Sarraf | |
| 5,631,112 A | * | 5/1997 | Tsai et al. .................... 430/394 |
| 5,641,608 A | | 6/1997 | Grunwald et al. ........... 430/302 |
| 5,739,898 A | | 4/1998 | Ozawa et al. .................. 355/53 |
| 5,742,362 A | | 4/1998 | Chikamichi .................... 349/2 |
| 5,777,724 A | | 7/1998 | Suzuki ........................ 355/68 |
| 5,795,686 A | | 8/1998 | Takizawa et al. .............. 430/5 |
| 5,847,812 A | | 12/1998 | Ooki et al. .................... 355/67 |
| 5,851,707 A | | 12/1998 | Shibuya et al. ................ 430/5 |
| 5,870,176 A | * | 2/1999 | Sweatt | |
| 6,136,509 A | * | 10/2000 | Gelbart | |

OTHER PUBLICATIONS

Ooki et al. *Experimental Study on Non–linear Multiple Exposure Method,* SPIE vol. 3051, pp. 85–93 [date unknown].
Neisser et al. *Simulation and Experimental Evaluation of Double Exposure Techniques,* SPIE vol. 3334, pp. 372–377. [date unknown].

\* cited by examiner

*Primary Examiner*—Mark F. Huff
*Assistant Examiner*—Kripa Sagar
(74) *Attorney, Agent, or Firm*—Oyen Wiggs Green & Mutala

(57) ABSTRACT

A stepper for imaging integrated circuit and flat panel displays uses a thermoresist instead of photoresist and separates the mask into multiple masks, each one containing only part of the features which need to be imaged. The fmal image is generated by combining the images from all the masks on a single die taking advantage of the fact that thermal resists do not follow the reciprocity law. For maximum resolution each one of the multiple masks contains features of only one size.

12 Claims, 5 Drawing Sheets

HIGH RESOLUTION OPTICAL STEPPER

CROSS REFERENCE TO RELATED APPLICATION

This application is a division of application Ser. No. 09/110,378 filed on Jun. 19, 1999 now abandoned and entitled HIGH RESOLUTION OPTICAL STEPPER. The subject matter of this application is related to the subject matter of and commonly owned application Ser. No. 09/093,854 entitled METHOD OF EXPOSING THERMORESIST, now U.S. Pat. No. 6,136,509.

FIELD OF THE INVENTION

The invention relates to imaging of etch resistant layers, also known as "resists", in order to fabricate high resolution patterns by etching or deposition. In particular, the invention relates to the manufacturing of integrated circuits and flat panel displays and the like using an optical stepper. A stepper is an imaging device used in the semiconductor industry to project an image of a mask onto a semiconductor wafer.

BACKGROUND OF THE INVENTION

Most integrated circuits today are fabricated using selective etching or deposition according to a master pattern known as a mask, using an imaging device known as a stepper. The process of fabricating high resolution patterns, mainly on planar objects, by selective etching or deposition has been well known for centuries. In general, the layer to be shaped or patterned is covered by a protective layer known as a "resist". The desired shapes are created in the protective layer, usually via photo-imaging. The exposed (or unexposed, if the resist is negative working) part of the image is removed, normally by using a liquid developer to expose the layer underneath. The exposed layer can now be etched through the openings in the resist layer, which protects the covered area from the etching process. Etching can be by wet chemicals or by dry plasma (a process widely used in the semiconductor industry).

Instead of etching an additive process can be used. In an additive process a material is deposited through the openings in a resist to add to the layer underneath the resist. This deposition can be done in a wet process (as in the well known "additive" process for manufacturing printed circuit boards) or in a dry process, such as a vacuum deposition by evaporation or sputtering. Another way of using a resist is in allowing chemical reactions, such as oxidation, to occur only in the areas not covered by the resist.

In general, a resist is an imagewise mask selectively controlling a chemical or physical process and limiting the process to follow the image pattern. The term "resist" should be interpreted in this broad sense throughout this disclosure and claims. Any other layer which has suitable properties and can be patterned by light or heat can be used as a resist. At the end of the process the remaining resist is normally removed, or "stripped".

Historically most resists were photoresists, i.e. activated and imaged by the photonic action of light. Because of this photonic action most photoresists operate in the UV part of the spectrum, where the photon energy is high. Some resists are exposed by other types of radiation, such as electron-beams. All photoresists and electron beam resists share one fundamental property: they respond to the total exposure, not to the momentary illumination. In optics, exposure is defined as the integral of illumination over time. For example, a photoresist can be exposed by 100 mW/cm$^2$ for 1 sec to yield an exposure of 100 mJ/cm$^2$ (100 mw×1 sec) or it can be exposed by 1000 mW for 0.1 sec (100 mW×0.1 sec=100 mW/cm$_2$) with similar results. This law is also known as the "reciprocity law" and it is the basic law governing the exposure of photoresists.

When a certain exposure is reached, a change occurs in the resist. Since exposure is a linear function of power and time, the principles of linear superposition apply. The most common resists operate by a change of solubility in a developer.

The law of reciprocity also requires a high contrast ratio and low stray light in optical systems used to expose photoresists and electron beam resists. For example, if an exposure system has a light leakage, or stray light, of 1% (e.g.: when exposure is "off", the light level does not drop to zero but only to 1% of the "on" state) the effect of this stray light can be as large (or larger) than the main exposure if left on the photoresist for a long time.

An even larger problem is caused when trying to image high resolution features: the point spread function of the optical system causes a "spreading" of light from each feature. This causes light from one feature to overlap with adjacent features and lowers the resolution. This problem is most severe in the semiconductor industry when using steppers to image a semiconductor wafer, typically a silicon wafer.

The basic elements of a stepper are shown in FIG. 1, where a mask 1, containing a pattern which has to be copied onto silicon wafer 4 is illuminated by light source 2. Mask 1 is imaged with a reduction lens 3 to form image 5, typically at a 5× reduction. Wafer 4 is stepped by x-y positioning system 6 and 7 and each area, known as a die, is exposed with the pattern of mask 1. Typically wafer 4 is coated with photoresist before exposure, however in some cases a different layer which is capable of responding to light is used. Because of the extremely fine features (below 1 micron) in image 5 which are imaged on each die, lens 3 is not capable of fully resolving all detail without some distortion of features.

If a cross section of the image of the mask 1 is taken along line 8 it would look like graph 9 in FIG. 2. If a cross section of the same image is taken at the surface of the wafer 4 along the line 8' (FIG. 1) it would look like graph 10 in FIG. 2. For further details on microlithography in general, and operation of steppers in particular, any modern book on the subject can be consulted, such as: "Handbook of Microlithography, Micromachining and Microfabrication", Volume 1 and 2, Edited by P. Rai-Choudhury, SPIE Press 1997, ISBN book number 0-8194-2378-5 (V.1) and 0-8194-2379-3 (V.2).

Referring now to FIG. 2, mask 1 is transmitting light in all areas not covered by an opaque layer. The image is made of pixels (picture elements) numbered from 1 to 16 in FIG. 2. Graph 9 shows the light intensity distribution just under mask 1. After passing through the lens, this light distribution is distorted by the limited resolution of the lens (item 3 in FIG. 1). The resulting light distribution is shown in graph 10. Photoresists are formulated to have a sharp threshold. Once the exposure level crosses the threshold a chemical change occurs. The change is normally a change in the solubility of the resist in a solvent. Because of this sharp threshold a sharp image can be produced in spite of the fact that graph 10 cannot fully reproduce the details of mask 1. As long as all desired features cross the threshold an image will be formed. Line 11 represents the threshold. FIG. 2 shows the use of a positive resist, which is washed away in all exposed areas. The same theory also applies to negative resists.

The resist is exposed in all areas of image 5 where a graph 10 crossed threshold 11. In the exposed areas, the resist is washed away on the die. The features of image 5 are imaged sharply, however, their dimensions are distorted, as can be seen by comparing the pattern imaged onto wafer 4 to mask 1 in FIG. 2. For reasons of clarity the pattern imaged onto wafer 4 and mask 1 are shown at the same size, while in most cases the pattern imaged onto wafer 4 is a reduced image. For the same reasons only a one dimensional section is shown, while the same effect is happening in the other dimension as well. All graphs are shown along the X axis (as defined in FIG. 1) but the identical situation also happens in the Y axis. Also, for clarity the fact that the image on wafer 4 may be inverted (depending on the optical system used) is not shown in the graphs.

Because both the optical system and the photoresist behave as linear systems (at least as far as accumulation of exposure is concerned) the principle of linear superposition will hold. This principle states that $f(a+b)=f(a)+f(b)$, or the response of the system to a function made up of multiple parts is equal to the sum of the responses of the system to each part when each part is applied separately. This principle is illustrated in FIG. 3. Mask 1 can be separated into two masks, 1A and 1B each one containing only part of the image. In FIG. 3, all the transmissive pixels with an even number are placed on mask 1A, while all the odd-numbered transmissive pixels are on mask 1B. Graphs 9A and 9B generate exposure functions 10A and 10B corresponding to masks 1A and 1B. Because of the principle of linear superposition the exposures on the photoresist layer add up to graph 11, even if exposure 10A and 10B are applied sequentially and at a considerable time delay between exposures. The resultant exposure function 10 and image 5 will be identical to those shown in FIG. 2. In other words, there is nothing to be gained by breaking up the mask into multiple masks if the sum of the images equals the original image.

The difficulty of imaging features having the desired dimensions in a die on wafer 4 can be appreciated from FIG. 3. If exposure is decreased graph 10 will move down relative to threshold 11. Some features will change to become more accurate (for example, pixels 3 and 5) while others will become worse (such as pixel 11). This leaves a very narrow rang e of exposure, known as a "process window" in which the system can be used. Even at this optimal exposure isolated clear openings become too small and wide clear openings become too wide (for positive resists).

Recently a different type of resist, known as thermoresist, has been used in the manufacturing of printing plates and printed circuit boards. A thermoresist (also known as a thermal resist or heat-mode resist) changes solubility when a certain temperature, rather than a certain accumulated exposure, has been reached. Such thermoresists are imaged using near infra-red light and therefore are also known as "IR resists". Some examples of thermoresists are disclosed in the following U.S. Pat. Nos. 4,619,894 (Bozler); 5,512,418 (Ma); 5,641,608 (Grunwald); 5,182,188 (Cole); and 5,328,811 (Brestel). Thermal resist is also available from Creo Ltd. (Lod Industrial Park, Israel), sold under the trade name "Difine 4LF". All of the above-mentioned thermoresists respond to temperature and do not follow the reciprocity law.

It is not possible to have a practical true thermoresist which follows the reciprocity law. Such a thermoresist would be exposed simply by long exposure to ambient temperature just as a photoresist will g et exposed by a long exposure to ambient light). While it is possible to shield a photoresist from ambient light it is not practical to shield a thermoresist from ambient temperature. Therefore a practical thermoresist cannot obey the reciprocity law. Prolonged exposure to ambient temperatures below the threshold temperature has little effect on a thermoresist. Obviously, the threshold temperature needs to be well above the temperatures expected to be encountered in shipping and storage.

When the chemical reaction in a thermoresist does not have a sharp threshold temperature, the chemical composition is formulated to keep the reaction rate very low at room temperature. This is not difficult to do, as most chemical reaction rates approximately double every 10 degrees centigrade. Thus the reaction rate in a thermoresist exposed at 350 degrees centigrade can be a billion times faster than at 25 degrees. Using lasers it is fairly easy to raise the temperature of a thermoresist to over 1000 degrees. Such a thermoresist will appear to have a distinct threshold simply because the reaction rate at lower temperature slows down exponentially. To follow the reciprocity law the reaction rate would have to change in a linear fashion with temperature.

SUMMARY OF THE INVENTION

It is an object of the invention to increase the resolution achievable when using steppers by separating the mask into multiple masks, each mask containing only part of the information. Another object of the invention is to overcome the limitations of current steppers by using thermoresists, which can be applied in thinner layers than photoresists for increased resolution. This invention is enabled because thermoresists violate the reciprocity law. Such thermoresists do not integrate the exposure, and any stray heat dissipates quickly. It is therefore possible to image thermoresists by using multiple exposures without adding up stray light in the areas not being exposed. Separating the image into multiple exposures places fewer demands on the imaging optics since each exposure images a mask which contains fewer than all of the features to be imaged. These and other objects of the invention will become apparent by considering the following description in conjunction with the drawings.

A stepper for imaging integrated circuit and flat panel displays uses multiple masks, each one containing only part of the features which need to be imaged. The final image is generated by combining the images from all the masks on a single die taking advantage of the fact that thermal resists do not follow the reciprocity law. For maximum resolution each one of the multiple masks should contain features of only one size.

BRIEF DESCRIPTION OF DRAWINGS

In figures which illustrate non-limiting embodiments of the invention.

DESCRIPTION

Figure 1:
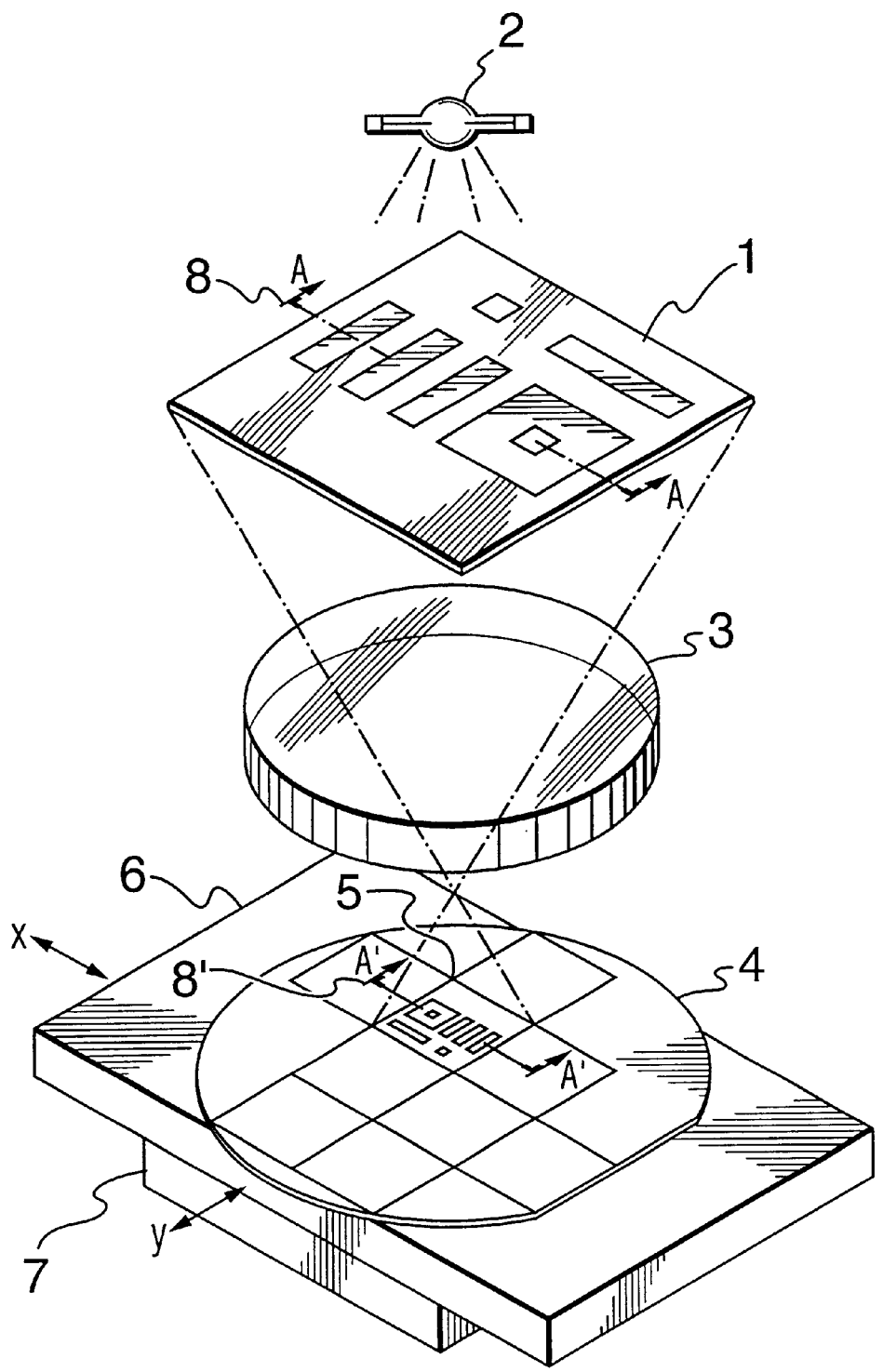
FIG. 1 is an isometric view of a prior art optical stepper.

Referring now to FIG. 1, which shows the key elements of an optical stepper, mask 1 is imaged on die 5 which is part of wafer 4 by lens 3. Wafer 4 can be moved in the X direction by mechanical stage 6 and in the Y direction by mechanical stage 7. All other details of an optical stepper are omitted as they are the same in the present invention as in prior art steppers. To practice the invention lamp 2 is replaced by a pulsed UV light source, such as a pulsed xenon lamp. A suitable lamp is model 457A available from Xenon Corporation (Woburn, Mass.). For steppers already using a pulsed light source, such as an excimer laser, no modification of the light source is required except an increase in pulse power of about 2× to 20×, depending on the thermoresist used. The light source is preferably capable of exposing the resist being used in a duration of less than 1 millisecond. The second modification required for the invention is the use of a resist which does not obey the reciprocity law. Preferably the resist is a thermoresist. The third modification is replacing mask 1 by a set of sub-masks 1A, 1B, 1C, 1D, imaged in sequence, each one containing part of the image of mask 1. The most preferred method is to separate the image on mask 1 into multiple sub-masks in a manner which keeps all image elements on each sub-mask the same size. For example if mask 1 is separated into four sub-masks it is possible to make each one of the sub-masks so it contains single size features, said features equal in size to the smallest feature of mask 1.

Figure 2:
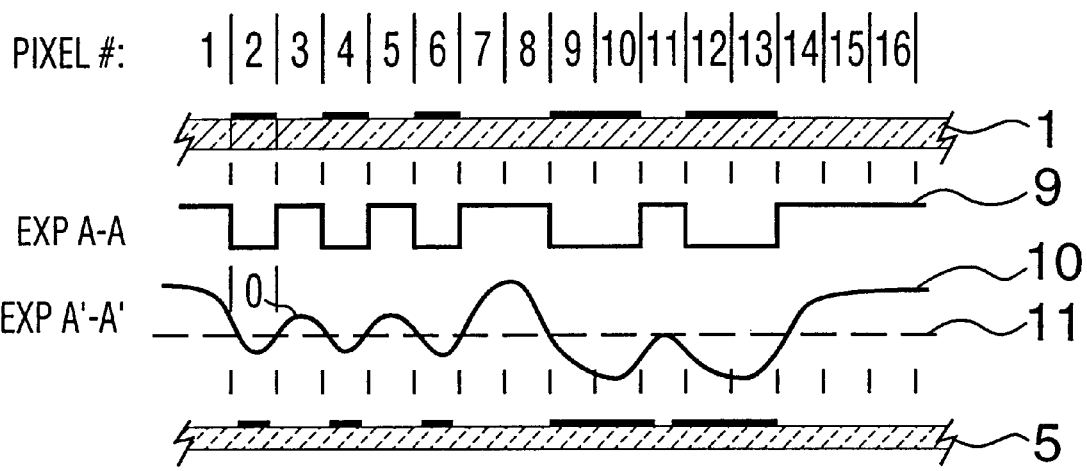
FIG. 2 is a schematic representation of the prior art imaging process in an optical stepper.
Figure 4:
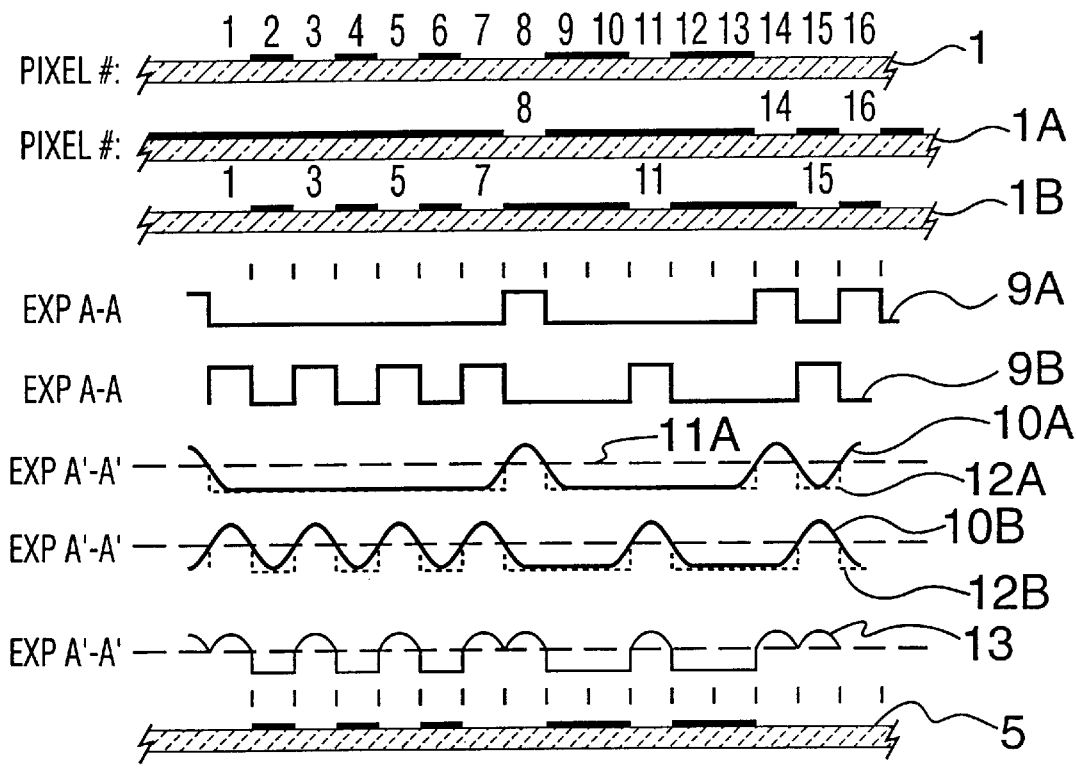
FIG. 4 is a schematic representation of the imaging process according to the invention, showing the improvement possible by separating the mask into multiple masks.

The benefit of separating the mask into multiple sub-masks are shown in FIG. 4. Mask 1 contains a series of openings which transmit light. The mask is normally fabricated by etching these openings in chrome-coated glass. The imaged area of mask 1 can generally be divided into an array of pixels. Each pixel can either coincide with an opening or not. The pixels can be identified by numbers. Assuming the smallest opening is a single pixel (while clearly understanding that the smallest opening can consist of multiple pixels) some openings are located at even numbered pixels while others are odd numbered. For example, mask 1 in FIG. 2 has openings at pixel numbers 1, 3, 5, 7, 8, 11, 14, 15, 16. It should be understood that mask 1 is two dimensional and FIG. 4 represents a single section (section A—A along line 8 in FIG. 1) through this mask.

Mask 1 can be replaced by two sub-masks, 1A and 1B, containing the even-numbered and odd-numbered openings respectively. The light distribution of sub-mask 1A is shown by graph 9A which is converted to 10A after imaging, graph 10A representing the exposure at cross section A'—A' along line 8' in FIG. 1. If a thermoresist is used it will undergo a chemical or physical change at all points where exposure 10A exceeded threshold 11 (or, more precisely, the temperature exceeded the threshold temperature for an ideal thermoresist). Obviously, the exposure time needs to be very brief, in the range of nanoseconds to microseconds, to avoid all heat escaping the substrate. This is the reason for the use of a pulsed light source, unlike the continuous light source used in most optical steppers today. All areas heated to temperatures above the threshold exposure will be transformed (for a resist, change their solubility) while all the areas in which exposure (or temperature, for an ideal thermoresist) did not reach threshold will cool down and behave as they were never exposed. This changes exposure graph 10A into an effective exposure graph 12A. The closer the resist is to an ideal thermoresist, the closer the equivalent exposure will be to graph 12A.

Figure 3:
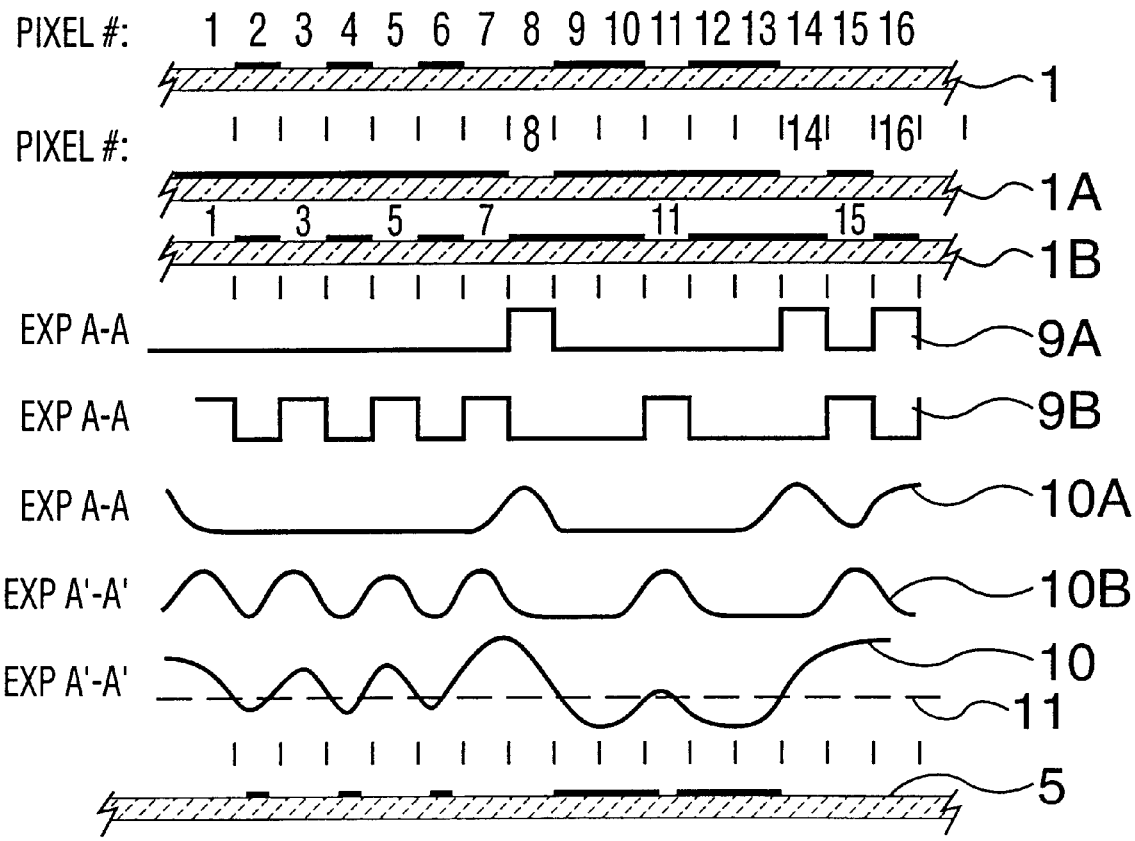
FIG. 3 is a schematic representation of the prior art imaging process in an optical stepper showing the lack of improvement from separating the mask into multiple masks.
Figure 5:
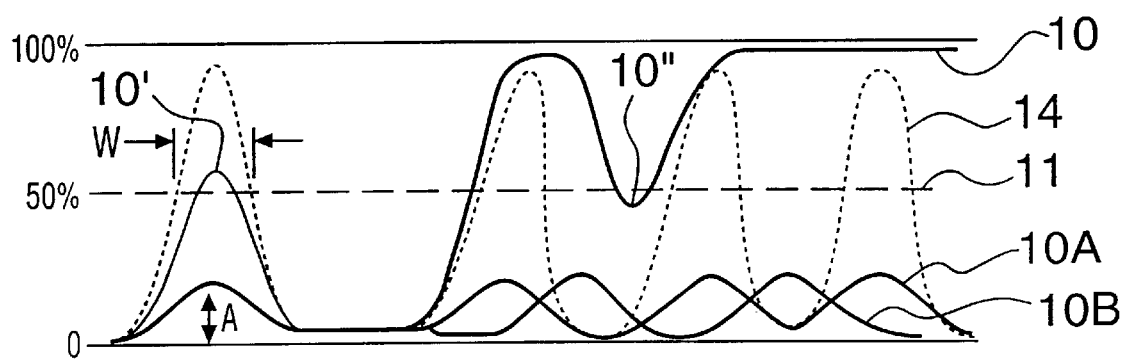
FIG. 5 is a schematic comparison between the prior art imaging process and the process of the invention.

Now sub-mask 1A is replaced by sub-mask 1B, containing all the odd numbered openings. This results in exposure function 9B becoming 10B after imaging and 12B after heat has dissipated. Since both 12A and 12B are imaged on same area of die 5 the equivalent exposure will be graph 13, generating correctly sized features on die 5 (compare graph 13 and die 5 in FIG. 4 to graph 10 and die 5 in prior art FIG. 3). It should be noted that while graph 13 is equivalent exposure the image was formed in two steps. The even numbered pixels were fully imaged in the first step, shown by graph 12A, while the odd numbered pixels were imaged separately in the second step, shown by graph 12B. Any stray light (or heat) added by graph 12B to the image formed by 12A has a negligible effect, as any heat below threshold 11 will dissipate rapidly. The thermal time constant of typical thermoresist layers is a few microseconds for a one micron thick resist layer, thus it is sufficient to wait a few microseconds between using sub-mask 1A and sub-mask 1B to make the exposures almost independent of each other. The benefit of making the exposures independent will become obvious from FIG. 5.

In order to image with a prior art stepper the resolution of the lens had to be sufficient to cause the light change caused by the smallest feature to exceed 50% of the light change caused by the largest feature. This is shown by the relationship of graph 10 and threshold 11. In order to resolve the smallest individual opening 10' (transparent feature) the exposure has to exceed the threshold. At the same time overall exposure cannot be increased, otherwise the smallest opaque feature 10" will not be able to reduce the light below the threshold 11. This is also the reason threshold 11 has to be placed at about the midpoint between the light level generated by the largest opaque area (nearly zero) and the light level generated by the largest clear area (shown as 100% in FIG. 5). Any attempt to improve the reproduction of feature 10' will be at the expense of feature 10".

The problem is completely solved by this invention if the image can be separated into multiple images, each one containing image elements of the same size. If all elements are of the same size and are sufficiently separated, even a response which is a fraction of the 100% level in FIG. 5 can be used by increasing the overall exposure level. If the exposure created by each mask only reaches the level shown as "A" in graph 10A in FIG. 5 (due to limited resolution of the optical system) the total power of lamp 2 in FIG. 1 can be raised until graph 10A is scaled up to graph 14, crossing threshold 11 to generate the correct feature size W. At the second exposure graph 10B is scaled up the same way. The interaction between features 10' and 10" is now minimal for two reasons. First, adjacent features are never imaged at the same time, as, on any one sub-mask, any two features are separated by at least the width of one feature. Secondly, any energy (light or heat) below the threshold is dissipated before any adjacent feature is imaged, minimizing interaction between features as long as a thermoresist is used (or, more generically, a material not obeying the reciprocity law is used).

Figure 6:
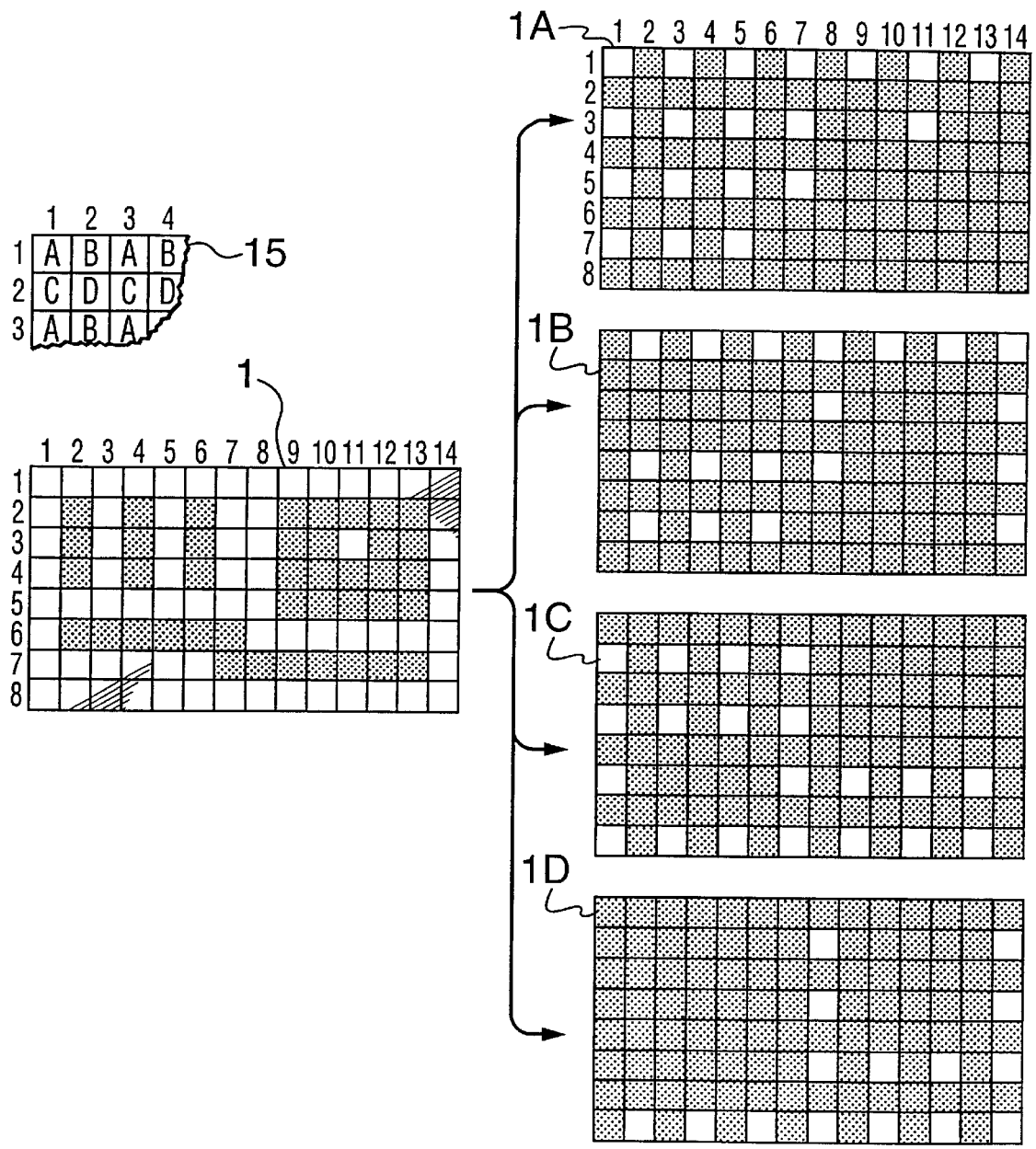
FIG. 6 is an example of separating a mask into multiple masks according to the invention; and, FIG. 7 is an alternate method of separating the mask into multiple masks.

In theory response level "A" can be a very small fraction of the response 10' and 10" required from prior art steppers. In practice it is limited by interaction between features. The smaller response "A" is, the further different features on each mask need to be separated to avoid interaction between features exposed simultaneously. This may require replacing one mask by a large number of sub-masks. For example, if features are separated by at least one feature in each direction, four sub-masks are required to replace one mask, as shown in FIG. 6. If the required separation is two features, nine sub-masks will be required to replace one sub-mask, however, the value "A" in FIG. 5 can be lower, offering higher resolution for a given stepper. For a given optical system, the value "A" will decrease as features become smaller. On the other hand, the high density of integrated circuits typically requires the use of the smallest features possible. In this disclosure "feature" refers to the smallest element used in the image. A feature can be a single pixel or a group of pixels. For example, if the mask contains one micron lines generated with a 0.1 micron addressability, a pixel will be 0.1 micron but the smallest feature is one micron.

FIG. 6 shows one example of separating a mask 1 into four sub-masks 1A, 1B, IC and 1D in order to have all features the same size and separated from each other by at least one feature. Obviously, other schemes of separating an image into images which are easier to reproduce can be used. An alternate method is to image all large features on a single mask, in order to take advantage of the higher light throughput of larger features, and to use separate masks for fine features. In FIG. 6 the image is divided into odd and even rows and columns. Sub-mask 1A contains only the openings which are in odd rows and columns as shown by insert 15. Sub-mask 1B contains odd rows and even columns. Sub-mask 1C contains even rows and odd columns. Sub-mask 1D contains all the openings which were located on even rows and columns. Needless to say, register must be maintained between the different images, however this is part of the prior art of stepper design and a required feature in all steppers. Since the invention has to be used with pulsed light, with pulse duration not exceeding a few microseconds, imaging can be done while the wafer (4 in FIG. 1) is still moving. Pulsed imaging also helps to eliminate the effect of vibrations. For example, for a wafer velocity of 100 mm/sec and an excimer laser pulse of 50 nS the total motion blur is 100 mm/sec ×50 nS=5 nm, which is negligible in most applications.

Using this invention at very high resolutions (over two times of what can be achieved with photoresists) also requires very thin resists. This is needed to avoid thermal lateral diffusion from reducing resolution. Vertical thermal diffusion does not affect resolution. Thin resist are also more compatible with excimer lasers, which are absorbed strongly in the top layer of thicker resists. The present invention is particularly useful when used with thin thermal resists prepared according to U.S. Pat. No. 4,619,894, hereby incorporated in this disclosure by reference.

While the preferred embodiments show a "stepper" type imaging system the invention should be interpreted in a broader sense to all imaging applications using an optical system to transfer an image from a master, or mask, to a substrate, by using a coating on the substrate not following the linear superposition principle and by separating the image of the mask into multiple sub-masks. Also while the mask is normally a non-alterable image it is obvious that an electronically alterable mask such as a two dimensional light valve can be substituted for a fixed mask. The advantage of an electronically alterable mask is that it is easier to separate the image into a large number of images. Another obvious variation is to use a rapidly scanning light spot or line also known as "flying spot scanner" on the mask in order to create a very short exposure for each feature instead of pulsing the light source. This embodiment is particularly useful when using CW UV lasers, such as a frequency quadrupled YAG laser operating at 266 nm. The spot size of such a laser can be larger than the feature size being imaged.

Figure 7:
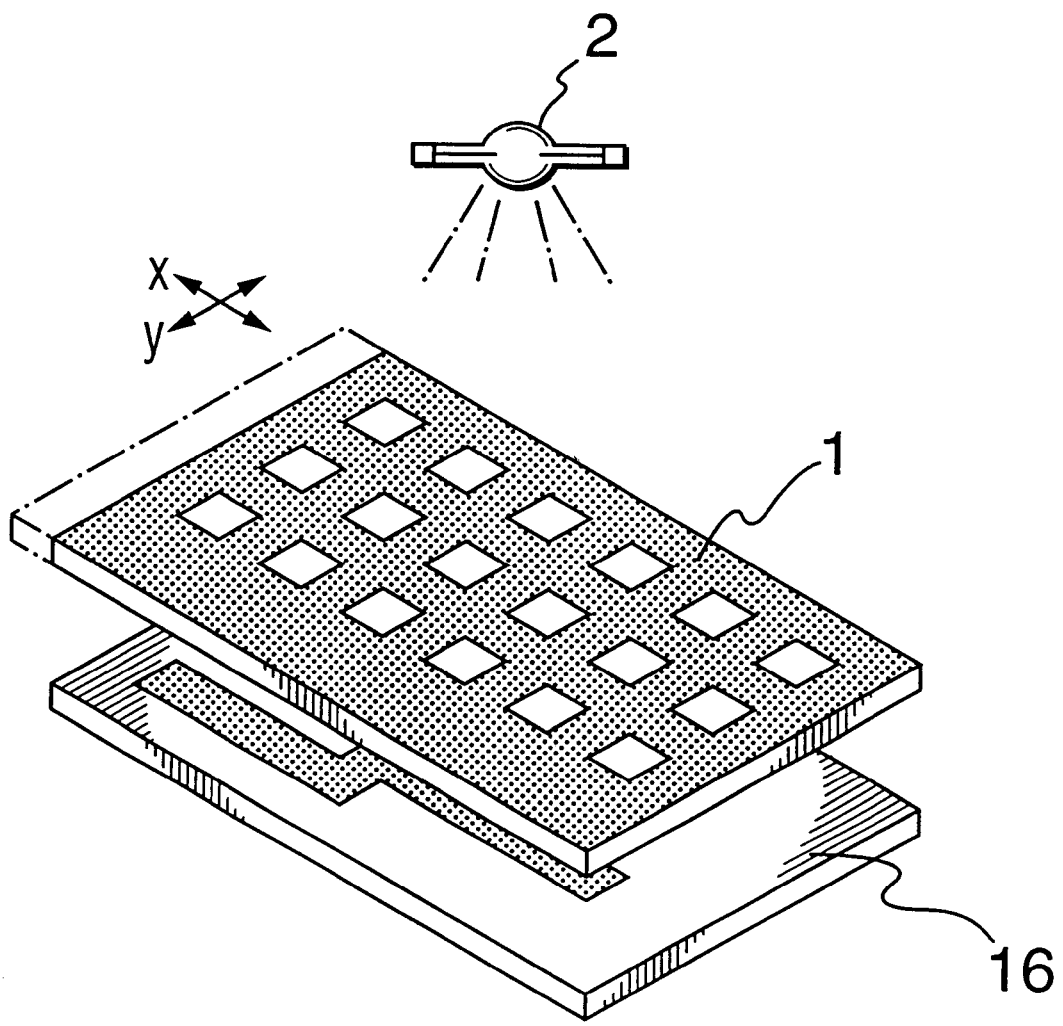

An alternative to separating the mask into multiple masks is shown in FIG. 7 in which only one mask is used but a separate illumination mask is moved over mask 1 in steps of one pixel (or the smallest feature) and exposed multiple times in order to separate image 1 into multiple images similar to the images 1A, 1B, 1C and 1D in FIG. 6. Any combination of masks, illumination mask and scanning spot or line illumination of a mask in conjunction with a coating not obeying the linear superposition law (or reciprocity law, which is closely related) should be understood to be covered by this disclosure. Because of linear superposition, all these methods do not improve the performance of imaging system unless they use a resist (or other coating) which does not obey this law.

The fact that any exposure of a thermoresist below the threshold value will dissipate as stray heat also allows the invention to correct for small deviations in flatness in the die as well as other focus errors. Any area of the image which is out of focus will not image at all, as graph 14 in FIG. 5 will become flattened and not cross the threshold. These areas can be re-imaged at a different focus setting, for example by vertically moving lens 3 in FIG. 1 in small increments. In conventional imaging any out-of-focus area cannot be re-imaged as the new exposure will combine with the out-of-focus exposure. This ability to expose each area multiple times, each exposure at a slightly different focus, overcomes the very low depth of focus (about 1 micron) of modern optical steppers.

As will be apparent to those skilled in the art in the light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method for providing an imagewise exposed resist on a surface, the method comprising:
   a) providing a light source and a surface coated with a thermoresist, the thermoresist convertible from an unexposed state to an exposed state when heated to a temperature in excess of a threshold temperature by exposure to radiation from the light source;
   b) providing an image to be exposed on the thermoresist, the image comprising at least a plurality of features, the features comprising features in a first set of features and features in a second set of features, the first and second sets of features both defined by a mask in an optical path between the light source and the surface;
   c) illuminating the first set of features with the light source to image the first set of features onto the thermoresist without converting the thermoresist to the exposed state in areas corresponding to the second set of features, this step of illuminating comprising providing an illumination mask in a first position in an optical path between the light source and the surface; and,
   d) subsequently illuminating the second set of features with the light source to image the second set of features onto the thermoresist, this step of illuminating comprising providing the illumination mask in a second position translated relative to the first position in the optical path.

2. A method for providing an imagewise exposed resist on a surface, the method comprising:
   a) providing a light source and a surface coated with a thermoresist, the thermoresist convertible from an unexposed state to an exposed state when heated to a temperature in excess of a threshold temperature by exposure to radiation from the light source;
   b) providing an image to be exposed on the thermoresist, the image comprising at least a plurality of features, the features all being larger than a minimum size and comprising features in a first set of features and features in a second set of features whereby all features in the first set of features are spaced apart from other features in the first set of features by at least the minimum size and all features in the second set of features are spaced apart from other features in the second set of features by at least the minimum size;

c) providing a mask which includes the first and second sets of features, and an illumination mask comprising an array of spaced apart features, the mask and illumination mask together permitting the light source to illuminate the surface at locations where a feature of the mask coincides with a feature of the illumination mask, wherein the first set of features is imaged when the illumination mask is in a first registration relative to the mask and the second set of features is imaged when the illumination mask is in a second registration relative to the masks;

d) illuminating the first set of features with the light source to image the first set of features onto the thermoresist without converting the thermoresist to the exposed state in areas corresponding to the second set of features; and, e) subsequently illuminating the second set of features with the light source to image the second set of features onto the thermoresist.

3. A method for providing an imagewise exposed resist on a surface, the method comprising:

a) providing a light source and a surface coated with a thermoresist, the thermoresist convertible from an unexposed state to an exposed state when heated to a temperature in excess of a threshold temperature by exposure to radiation from the light source;

b) providing a plurality of sub-masks, each of the sub-masks defining a set of features for imaging on the substrate;

c) sequentially imaging each of the sets of features on the thermoresist by interposing each of the sub-masks in register in an optical path between the light source and the thermoresist and illuminating the surface with the light source to convert areas of the thermoresist corresponding to the set of features from the unexposed state to the exposed state; and, d) waiting for a period at least equal to a thermal time constant of the thermoresist between imaging each of the sets of features.

4. The method of claim 3 wherein all of the features on each one of the sub-masks are the same size.

5. The method of claim 3 using four sub-masks wherein the features on each sub-mask are the same size and are separated from other features on the sub-mask by a distance of at least one feature size.

6. The method of claim 3 wherein the features of each sub-mask comprise cells in a regular array comprising rows and columns of equal-sized cells, the cells comprising light-blocking cells and light-passing cells, wherein each feature of the sub-mask is between adjacent columns of light-blocking cells and adjacent rows of light-blocking cells.

7. The method of claim 3 wherein providing the plurality of sub-masks comprises dividing the image features into an array comprising a plurality of rows and columns, the columns comprising interleaved odd and even columns and the rows comprising interleaved odd and even rows, placing on a first sub-mask features in odd rows and odd columns, placing on a second sub-mask features in odd rows and even columns, placing on a third sub-mask features in even rows and odd columns, and placing on a fourth sub-mask features in even rows and even columns.

8. The method of claim 7 wherein imaging each set of features comprises scanning a laser over the sub-mask corresponding to the set of features.

9. The method of claim 3 wherein the surface is non-planar and imaging each set of features comprises illuminating the sub-mask with the light source and imaging the illuminated sub-mask onto the resist with a variable focus optical system a plurality of times with the optical system at a different focus setting each time.

10. A method for providing an imagewise exposed resist on a surface, the method comprising:

a) providing a light source and a surface coated with a resist, the resist convertible from an unexposed state to an exposed state by exposure to radiation from the light source:

b) providing an image mask defining features to be imaged on the substrate, each of the features, comprising a single pixel;

c) providing an illumination mask comprising an array of spaced apart light passing areas;

d) sequentially imaging a plurality of sets of the features on the resist by:
  placing the image mask and the illumination mask in an optical path extending between the light source and the surface;
  exposing the surface with light from the light source which is passed both by the mask and by the illumination mask to image a set of features on the surface;
  translating the illumination mask relative to the image mask so as to include translations in each of two dimensions; and,
  exposing the surface with light from the light source which is passed both by the mask and by the illumination mask in its translated position to image another set of features on the surface.

11. The method of claim 10 wherein the illumination mask comprises a regular two-dimensional array of equal-sized rectangular light passing areas spaced apart by a distance equal to twice a width of each light passing area.

12. The method of claim 11, wherein the light passing areas are square.

* * * * *